United States Patent
Arai et al.

(10) Patent No.: US 6,222,314 B1
(45) Date of Patent: Apr. 24, 2001

(54) ORGANIC ELECTOLUMINESCENT DEVICE WITH INORGANIC INSULATING HOLE INJECTING LAYER

(75) Inventors: Michio Arai, Tokyo; Isamu Kobori; Etsuo Mitsuhashi, both of Ibaraki, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/234,507

(22) Filed: Jan. 21, 1999

(30) Foreign Application Priority Data

Jul. 24, 1998 (JP) .................................. 10-225311
Nov. 26, 1998 (JP) .................................. 10-352086

(51) Int. Cl.$^7$ .............................. H01J 1/62; H01J 63/04
(52) U.S. Cl. ................ 313/506; 313/498; 313/503; 313/504; 313/509
(58) Field of Search ................... 313/506, 498, 313/503, 504, 509

(56) References Cited

U.S. PATENT DOCUMENTS

| | | | |
|---|---|---|---|
| 5,952,779 | 9/1999 | Arai et al. | 313/504 |
| 5,969,474 | 10/1999 | Arai | 313/504 |
| 5,981,092 | 11/1999 | Arai et al. | 428/690 |

FOREIGN PATENT DOCUMENTS

| | | |
|---|---|---|
| 0 668 620 | 8/1995 | (EP) . |
| 61-37883 | 2/1986 | (JP) . |
| 1-312873 | 12/1989 | (JP) . |
| 5-3080 | 1/1993 | (JP) . |
| 8-288069 | 11/1996 | (JP) . |
| 9-260062 | 10/1997 | (JP) . |

*Primary Examiner*—Vip Patel
*Assistant Examiner*—Kevin Quarterman
(74) *Attorney, Agent, or Firm*—Oblon Spivak, McClelland, Maier & Neustadt, P.C.

(57) ABSTRACT

An organic EL device has a hole injecting electrode, an electron injecting electrode, an organic layer between the electrodes, and an inorganic insulating hole injecting layer between the hole injecting electrode and the organic layer. The inorganic insulating hole injecting layer contains silicon oxide or germanium oxide or a mixture thereof as a main component, and the main component is represented by $(Si_{1-x}Ge_x)O_y$, wherein $0 \leq x \leq 1$ and $1.7 \leq y \leq 2.2$. The hole injecting layer further contains Cu, Fe, Ni, Ru, Sn, Au or a mixture thereof, The device has advantages including a long lifetime, improved efficiency, low operating voltage, and low cost, and is suited for use as high-performance flat-panel color displays.

3 Claims, 2 Drawing Sheets

ORGANIC ELECTOLUMINESCENT DEVICE WITH INORGANIC INSULATING HOLE INJECTING LAYER

This invention relates to an organic electroluminescent (EL) device and more particularly, to an inorganic/organic junction structure suitable for use in a device of the type wherein an electric field is applied to a thin film of an organic compound to emit light.

BACKGROUND OF THE INVENTION

In general, organic EL devices have a basic configuration including a glass substrate, a transparent electrode of tin-doped indium oxide (ITO) etc., a hole transporting layer of an organic amine compound, a light emitting layer of an organic fluorescent material exhibiting electronic conductivity and intense light emission such as an aluminum quinolinol complex (Alq3), and an electrode of a metal having a low work function such as MgAg, wherein the layers are stacked on the substrate in the described order.

The device configurations which have been reported thus far have one or more organic compound layers interposed between a hole injecting electrode and an electron injecting electrode. Structures having two or three organic compound layers are typical.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 3 and 4 illustrate typical configurations of organic EL devices.

In FIG. 3, a hole transporting layer 14 and a light emitting layer 15, both of organic compounds, are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16, wall of organic compounds, are formed between a hole injecting electrode 12 and an electron injecting electrode 13 on a substrate 11.

Reliability is a common problem to be solved for these organic EL devices. More particularly, organic EL devices in principle have a hole injecting electrode and an electron injecting electrode and need organic layers for effectively injecting and transporting holes and electrons from the electrodes, respectively. However, the organic materials of which the organic layers are formed are vulnerable during manufacture and have less affinity to the electrodes. Another problem is raised by the significantly accelerated degradation of organic thin films as compared with light emitting diodes (LED) and laser diodes (LD).

Also, most organic materials are relatively expensive. Any partial replacement of constituent films by an inexpensive inorganic material would give an economical merit in the manufacture of cost effective organic EL device-applied products.

There is also a desire to have an organic EL device having a further improved light emission efficiency, a low drive voltage and a minimal current consumption.

To solve this and other problems, a means for taking advantage of both an organic material and an inorganic semiconductor material has been devised. That is, an organic/inorganic semiconductor junction is established by substituting an inorganic p-type semiconductor for the organic bole transporting layer. These efforts are found in Japanese Patent No. 2636341, JP-A 139893/1990, 207488/1990, and 119973/1994. However, it was impossible to design EL devices which are superior in light emission properties and reliability to prior art organic EL devices.

SUMMARY OF THE INVENTION

An object of the present invention is to provide an organic EL device which can take advantage of both an organic material and an inorganic material, and has an extended effective life, an improved efficiency, a low drive voltage and a low cost.

An another object of the present invention is to provide an organic EL device of great commercial value for use as high-performance flat-panel color displays.

According to the invention, there is provided an organic electroluminescent device comprising a hole injecting electrode, an electron injecting electrode, at least one organic layer between the electrodes, and an inorganic insulating hole injecting layer between the hole injecting electrode and the organic layer. The inorganic insulating hole injecting layer contains silicon oxide or germanium oxide or a mixture of silicon oxide and germanium oxide as a main component. The main component is represented by the formula: $(Si_{1-x}Ge_x)O_y$ wherein x is from 0 to 1 and y is from 1.7 to 2.2. The inorganic insulating hole injecting layer further contains copper, iron, nickel, ruthenium, tin, gold, or a mixture thereof, preferably in an amount of up to 10 at %. The inorganic insulating hole injecting layer preferably has a thickness of 0.1 to 10 nm.

BEST MODE FOR CARRYING OUT THE INVENTION

Figure 1:
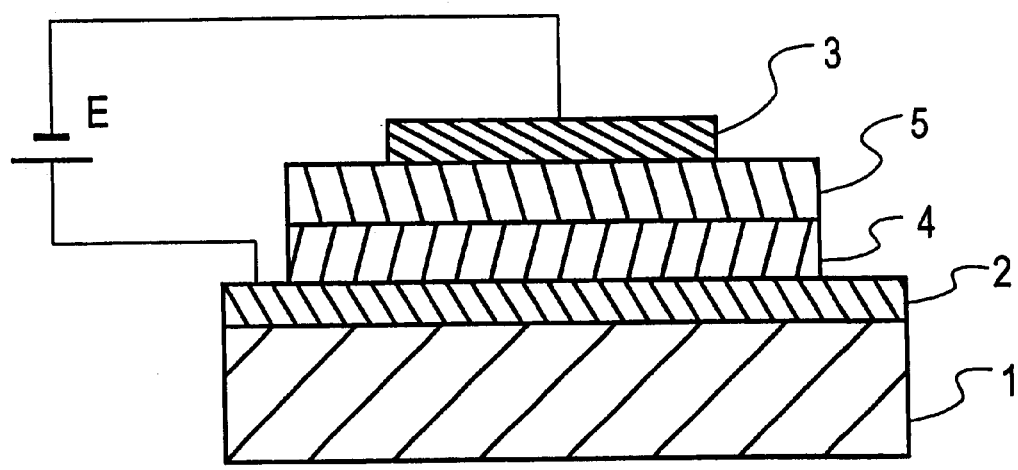
FIG. 1 is a schematic view illustrating the configuration of an organic EL device according to one embodiment of the invention.

The organic EL device of the invention has a hole injecting electrode and an electron injecting electrode on a substrate. At least an organic layer having a light emitting function is disposed between the electrodes. An inorganic insulating hole injecting layer is disposed between the hole injecting electrode and the organic layer. The hole injecting layer contains silicon oxide and/or germanium oxide as a main component. This oxide is represented by the formula: $(Si_{1-x}Ge_x)O_y$ wherein x is from 0 to 1 and y is from 1.7 to 2.2 (that is, $0 \leq x \leq 1$ and $1.7 \leq y \leq 2.2$). The hole injecting layer further contains at least one element selected from among copper (Cu), iron (Fe), nickel (Ni), ruthenium (Ru), tin (Sn), and gold (Au).

By controlling the oxygen content of silicon oxide and germanium oxide as the main component of the inorganic insulating hole injecting layer in the above-defined range, and by incorporating copper, iron, nickel, ruthenium, tin, or gold, which facilitates hole injection, to form conductive paths in the layer, it becomes possible to effectively inject holes from the hole injecting electrode to the organic layer on the light emitting layer side. At the same time, migration of electrons from the organic layer to the hole injecting electrode is restrained, ensuring effective recombination of holes and electrons in the light emitting layer. The organic EL device of the invention has both the advantages of inorganic material and the advantages of organic material. The organic EL device of the invention produces a luminance comparable to that of prior art devices having an organic hole injecting layer. Owing to high heat resistance and weather resistance, the organic EL device of the invention has a longer service life than the prior art devices and develops minimal leaks and dark spots. The use of an inexpensive, readily available inorganic material rather than relatively expensive organic materials offers the advantages of easy manufacture and a reduced manufacture cost.

In the formula: $(Si_{1-x}Ge_x)O_y$, x is from 0 to 1 and y is from 1.7 to 2.2, preferably from 1.85 to 2.1. The inorganic insulating hole injecting layer may be a thin film composed mainly of silicon oxide, germanium oxide, or a mixture of silicon oxide and germanium oxide. If y is more than this range and silicon or germanium has less vacancies, or y is less than this range and oxygen has more vacancies, the layer has a reduced hole injecting capability. The composition may be determined by chemical analysis.

The hole injecting layer further contains at least one element selected from among copper, iron, nickel, ruthenium, tin, and gold. Preferably it contains tin, nickel, or copper, especially nickel. The content of these elements is up to 10 at %, preferably 0.05 to 10 at %, more preferably 0.1 to 10 at %, especially 0.5 to 5 at % of the layer material. If the content is more than this range, the layer would have a reduced hole injecting capability. When two or more of these elements are used, the total content should preferably fall in the above-described range.

In addition, the hole injecting layer may contain less than about 5 at % in total of impurities such as H, or Me, Ar, Kr and Xe used as the sputtering gas.

As long as the overall hole injecting layer has the above-described composition on the average, the composition of the hole injecting layer need not be uniform. A layer structure having a graded concentration in a thickness direction is acceptable. The inorganic insulating hole injecting layer is normally amorphous.

The thickness of the inorganic insulating hole injecting layer is not critical although an appropriate thickness is about 0.1 nm to about 10 nm, more preferably about 1 rim to about 10 nm. Hole injection would become insufficient when the thickness of the hole injecting layer is outside the range.

Methods for preparing the inorganic insulating hole injecting layer include various physical and chemical thin film forming methods such as sputtering and electron beam (EB) vapor deposition, with the sputtering being preferred.

When the inorganic insulating hole injecting layer is formed by sputtering, the sputtering gas is preferably under a pressure of 0.1 to 1 Pa during sputtering. The sputtering gas may be any of inert gases used in conventional sputtering equipment, for example, Ar, Ne, Xe and Kr. Nitrogen ($N_2$) gas may be used if necessary. Reactive sputtering may be carried out in an atmosphere of the sputtering gas mixed with 1 to 99% of oxygen ($O_2$) gas. The target used herein is the above-described oxide or oxides, and either single source or multiple source sputtering may be carried out.

The sputtering process may be an RF sputtering process using an RE power source or a DC sputtering process, with the former being preferred. The power of the sputtering equipment is preferably in the range of about 0.1 to about 10 W/cm$^2$ for RF sputtering. The deposition rate is preferably in the range of about 0.5 to about 10 nm/min., especially about 1 to about 5 nm/min. The substrate is kept at room temperature (25° C.) to about 150° C. during deposition.

Figure 2:
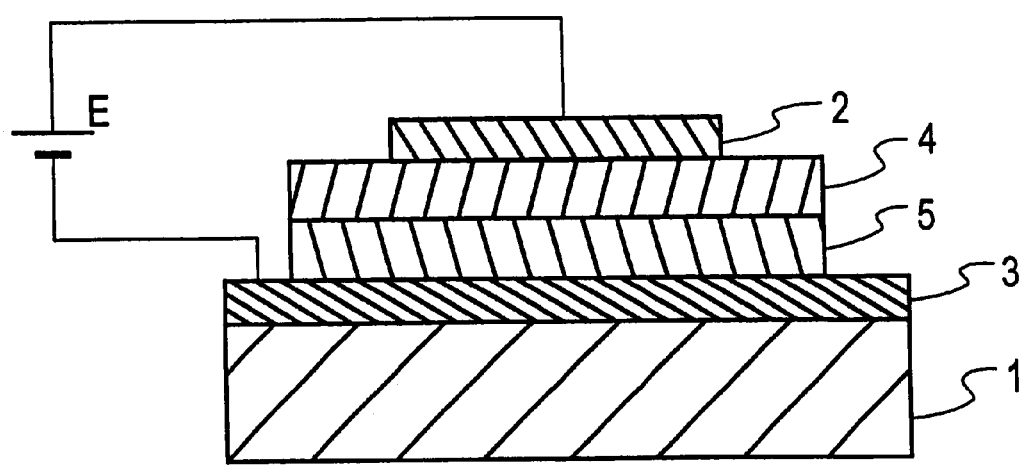
FIG. 2 is a schematic view illustrating the configuration of an organic EL device according to another embodiment of the invention.
Figure 3:
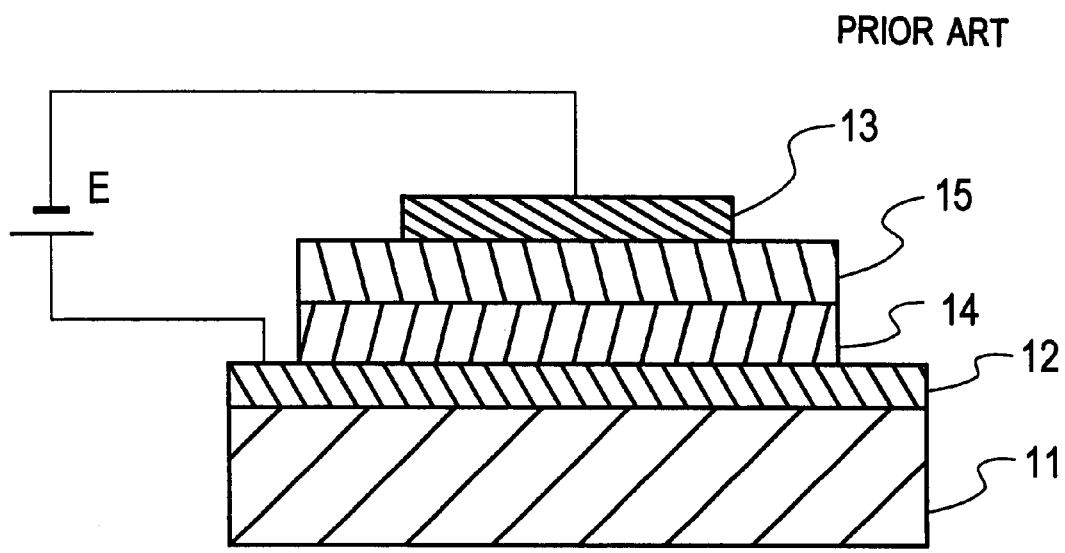
FIG. 3 is a schematic view illustrating a prior art organic EL device of the two-layer structure.
Figure 4:
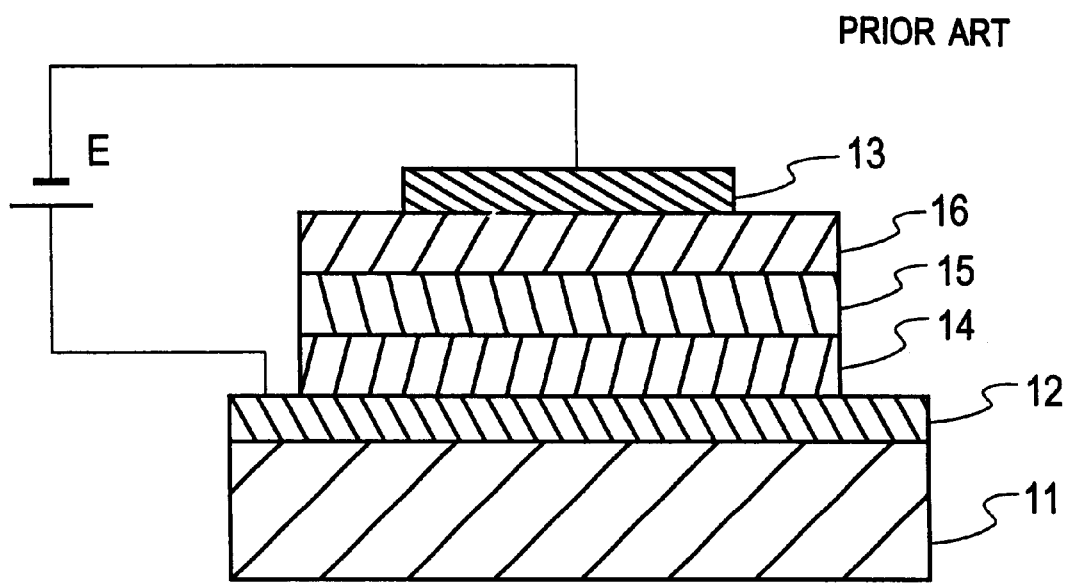
FIG. 4 is a schematic view illustrating a prior art organic EL device of the three-layer structure.

Referring to FIGS. 1 and 2, there are illustrated in schematic views the configuration of organic EL devices according to different embodiments of the invention. The device of FIG. 1 has the successively stacked configuration of substrate 1/hole injecting electrode 2/inorganic insulating hole injecting layer 4/light emitting layer 5/electron injecting electrode 3. The device of FIG. 2 has the inversely stacked configuration of substrate 1/electron injecting electrode 3/light emitting layer 5/inorganic insulating hole injecting layer 4/hole injecting electrode 2. The inversely stacked configuration helps light emerge from the side of the assembly opposite to the substrate. In the inversely stacked configuration, however, when the inorganic insulating hole injecting layer is deposited, the organic layer and other layer (if any) can be subjected to ashing and hence, damaged. It is thus recommended that the hole injecting layer is initially thinly deposited in the absence of oxygen and then thickly in the presence of oxygen. The thickness reached in the absence of oxygen is preferably about ⅕ to about ½ of the final thickness.

In FIGS. 1 and 2, a drive power supply E is connected between the hole injecting electrode 2 and the electron injecting electrode 3. It is understood that the light emitting layer 5 is a light emitting layer of broader definition including a hole injecting and transporting layer, a light emitting layer of narrower definition, a hole transporting layer, and so on.

The device of the invention may have a multi-stage configuration of electrode layer/inorganic layer (inorganic insulating hole injecting layer) and light emitting layer/electrode layer/inorganic layer and light emitting layer/electrode layer/inorganic layer and light emitting layer/electrode layer, or further repeated layers. Such a multi-stage configuration is effective for adjusting or multiplying the color of emitted light.

For the hole injecting electrode, materials capable of effectively injecting holes into the hole injecting layer are preferred. Useful are compositions based on tin-doped indium oxide (ITO), zinc-doped indium oxide (IZO), indium oxide ($In_2O_3$), tin oxide (Snot) or zinc oxide (ZnO). These oxides may deviate more or less from their stoichiometric compositions. For ITO, an appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight. The hole injecting electrode may further contain silicon dioxide ($SiO_2$) The content of silicon dioxide (SiO) is preferably about 0.5 to 10% as expressed in mol percent of $SiO_2$ based on ITO.

The electrode on the light exit side should preferably have a light transmittance of at least 80%, more preferably at least 90% in the light emission band, typically from 400 to 700 nm, and especially at each light emission. With a lower transmittance, the light emitted by the light emitting layer is attenuated through the electrode, failing to provide a luminance necessary as a light emitting device.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

The electron injecting electrode is preferably formed from materials having a low work function, for example, metal elements such as K, Li, Na, Mg, La, Ce, Ca, Sr, Ba, Al, Ag, In, Sn, Zn, and Zr, and binary or ternary alloys made of two or three such metal elements for stability improvement. Exemplary alloys are Ag—Mg (Ag: 0.1 to 50 at %), Al—Li (Li: 0.01 to 12 at %), In—Mg (Mg: 50 to 80 at %), and Al—Ca (Ca: 0.01 to 20 at %)+A thin film of such a material or a multilayer film of two or more materials may be used as the electron injecting electrode layer.

The electron injecting electrode thin film may have at least a sufficient thickness to effect electron injection, for example, a thickness of at least 0.1 nm, preferably at least 0.5 nm, more preferably at least 1 nm. Although the upper limit is not critical, the electrode thickness is typically about 1 to about 500 nm.

On the electron injecting electrode, an auxiliary or protective electrode may be provided, if desired. The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

The light emitting layer is a thin film of an organic compound participating in light emission or a multilayer film of two or more organic compounds participating in light emission.

The light emitting layer has the functions of injecting holes and electrons, transporting them, and recombining holes and electrons to create excitons. It is preferred that relatively electronically neutral compounds be used in the light emitting layer so that electron and holes may be readily injected and transported in a well-balanced manner.

In addition to the light emitting layer of the narrow definition, the light emitting layer may optionally include layers of organic materials such as a hole transporting layer and an electron injecting and transporting layer. The optional hole transporting layer has the functions of facilitating injection of holes from the inorganic insulating hole injecting layer, transporting holes stably, and blocking electrons. The optional electron injecting and transporting layer has the functions of facilitating injection of electrons from the electron injecting electrode, transporting electrons stably, and blocking holes. These layers are effective for increasing the number of holes and electrons injected into the light emitting layer and confining holes and electrons therein for optimizing the recombination region to improve light emission efficiency.

The thicknesses of the light emitting layer, the hole transporting layer, and the electron injecting and transporting layer are not critical and vary with a particular formation technique although their thickness is usually preferred to range from about 5 nm to about 500 nm, especially about 10 nm to about 300 nm.

The thickness of the hole transporting layer and the electron injecting and transporting layer is equal to or ranges from about 1/10 times to about 10 times the thickness of the light emitting layer although it depends on the design of a recombination/light emitting region. When the electron injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device of the invention contains a fluorescent material that is a compound having a light emitting capability. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 and the tetraarylethene derivatives described in JP-A 12969/1996.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolatoaluminum, tris(5,7-dibromo-8-hydroxyquiniolinolato)aluminum, and poly[zinc(II)-bis(8-hydroxy-5-quinolinyl)methane].

Also useful are aluminum complexes having another ligand in addition to 8-quinolinol or a derivative thereof. Examples include bis (2-methyl-8-quinolinolato)

(phenolato)aluminum(III), bis(2-methyl-8-quinolinolato) (orthocresolato)aluminum(III), bis(2-methyl-8-quinolinolato) (metacresolato)aluminum(III), bis(2-methyl-8-quinolinolato)(paracresolato)aluminum(III), bis(2-methyl-8-quinolinolato)(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminuam(III), bis(2-methyl-8-quinolinolato)(3,5-dimethylphenolato)aluminum(III), bis(2-methyl-8-quinolinolato) (3,5-di-tert-butylphenolato)aluminum(III), bis(2-methyl-8-quinolinolato) (2,6-diphenyl phenolato) aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(orthophenylphenolato)aluminum(III), bis(2,4-dimethyl-8-quinolinolato)(para-phenylphenolato) aluminum(III), bis(2,4dimethyl-8-quinolinolato)(meta-phenylphenolato) aluminum(III), bis(2,4-dimethyl-8-quinolinolato)(3,5-dimethylphenolato)aluminum(III), bis(2,4-dimethyl-8-quinolinolato)(3,5-di-tert-butylphenolato) aluminum(III), bis(2-methyl-4-ethyl-8-quinolinolato)(paracresolato)aluminum(III), bis(2-methyl-4-methoxy-8-quinolinolato) (paraphenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato) aluminum(III).

Also acceptable are bis(2-methyl-8-quinolinolato) aluminum(III) -g-oxo-bis(2-methyl-8-quinolinolato) aluminum (III), bis(2,4-dimethyl-8-quinolinolato)aluminum(III)-$\mu$-oxo-bis(2,4-dimethyl-8-quinolinolato)aluminum(III), bis (4-ethyl-2-methyl-8-quinolinolato)aluminum(Il) -g-oxo-bis (4-ethyl-2-methyl-8-quinolinolato)aluminum(III), bis(2-methyl-4-methoxyquinolinolato)aluminum(III)-$\mu$-oxo-bis (2-methyl-4- methoxyquinolinolato)aluminum(III), his(5-cyano-2-methyl-8-quinolinolato)aluminum(III)-$\mu$-oxo-bis (5-cyano-2-methyl-8-quinolinolato)aluminum(III), and bis (2-methyl-5-trifluoromethyl-8-quinolinolato)aluminum (III)-$\mu$-oxo-bis(2-methyl-5-trifluoromethyl-8-quinolinolato) aluminum(III).

Other useful host materials are the phenylanthracene derivatives described in JP-A 12600/1996 and the tetraarylethene derivatives described in JP-A 12969/1996.

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole transporting layer and compounds for the electron injecting and transporting layer to be described later, respectively. Inter alia, the compound for the hole transporting layer is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3)The aforementioned phenylanthracene derivatives and tetraarylethene derivatives are also preferable.

For the hole transporting layer, amine derivatives having intense fluorescence are useful, for example, the triphenyldiamine derivatives, styrylamine derivatives, and amine derivatives having an aromatic fused ring, exemplified above as the hole transporting material.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole transporting layer, there may be used various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraaryl-benzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

In the electron injecting and transporting layer which is optionally provided, there may be used quinoline derivatives including organic metal complexes having 8-quinolinol or a derivative thereof as a ligand such as tris(8-quinolinolato)

aluminum, oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

In forming the hole transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.1 $\mu$m. If the grain size is more than 0.1 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

Further preferably, a shield plate may be provided on the device in order to prevent the organic layers and electrodes from oxidation. In order to prevent the ingress of moisture, the shield plate is attached to the substrate through an adhesive resin layer for sealing. The sealing gas is preferably an inert gas such as argon, helium, and nitrogen. The inert gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesion at the time of bonding. The content of the spacer in the sealing adhesive is preferably 0.01 to 30% by weight, more preferably 0.1 to 5% by weight.

Any of adhesives which can maintain stable bond strength and gas tightness may be used although UV curable epoxy resin adhesives of cation curing type are preferred.

In the organic EL structure of the invention, the substrate may be selected from amorphous substrates of glass and quartz and crystalline substrates of Si, GaAs, ZnSe, ZnS, Gap, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity. It is also preferred to use a color filter capable of cutting external light of short wavelength which is otherwise absorbed by the EL device materials and fluorescence conversion layer, because the light resistance and display contrast of the device are improved. An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material. The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds. The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable. The light absorbing material is used when the light absorption of the fluorescent material is short, and may be omitted if unnecessary. The light absorbing material may also be selected from materials which do not cause extinction of fluorescence of the fluorescent material.

The organic EL device of the invention is generally of the dc or pulse drive type while it can be of the ac drive type. The applied voltage is generally about 2 to 30 volts.

EXAMPLE

Examples of the invention are given below by way of illustration and not by way of limitation, Example 1

A substrate of (7059) glass by Corning Glass Works was scrubbed using a neutral detergent.

By RR magnetron sputtering from a target of ITO oxide, a hole injecting electrode layer of ITO having a thickness of 200 nm was formed on the substrate at a temperature of 250° C.

After its ITO electrode-bearing surface was cleaned with UW/$O_3$, the substrate was secured by a holder in a vacuum deposition chamber, which was evacuated to a vacuum of $1 \times 10^{-4}$ Pa or lower.

Using a target of $SiO_2$ containing 3 at % of Ni, an inorganic insulating hole injecting layer was deposited to a thickness of 1 nm. The sputtering gas used was a mixture of 50 sccm of Ar and 50 sccm of $O_2$. Sputtering conditions included a substrate temperature of 25° C., a deposition rate of 1 nm/min., an operating pressure of 0.5 Pa, and an input power of 5 W/$cm^2$. The hole injecting layer as deposited had a composition of $SiO_{1.9}$ containing 2.5 at % of Ni.

With the vacuum kept, N,N,N',N'-tetrakis(m-biphenyl)1,1'-biphenyl-4,41-diamine (TPD), tris(8-quinolinolato)-aluminum (Alq3), and rubrene were evaporated at an overall deposition rate of 0.2 nm/sec. to a thickness of 100 nm, forming a light emitting layer. The layer consisted of a mixture of TPD and Alq3 in a volume ratio of 1:1 doped with 10 vol % of rubrene.

With the vacuum kept, AlLi was evaporated to a thickness of 5 nm, and Al was successively evaporated to a thickness of 200 nm to form an electron injecting electrode and an auxiliary electrode, respectively. A glass shield was sealed to the layer structure to complete an organic EL device.

An electric field was applied across the organic EL device in air, which exhibited diode characteristics. When biased to be positive on the ITO side and negative on the Al side, the current flow increased as the voltage increased. A distinct light emission was observed in an ordinary room. When the device was repeatedly operated for light emission, no drop of luminance occurred. When driven at 100 mA/$cm^2$, this organic EL device showed an initial luminance of 400 cd/$m^2$.

An accelerated test was then carried out by driving the device at 60° C. and a constant current of 50 mA/$cm^2$ for determining the life, This organic EL device maintained more than 60% of the initial luminance even after 200 hours of operation. In the organic EL device of the present invention, neither leakage nor dark spots were found.

Example 2

An organic EL device was prepared as in Example 1 except that in the step of depositing the inorganic insulating hole injecting layer, the flow rate of $O_2$ in the sputtering gas was changed. The resulting layer had the composition $SiO_{2.05}$ containing 2.7 at % of Sn. The device was examined for life.

This organic EL device maintained more than 60% of the initial luminance even after 200 hours of operation. In the organic EL device of the present invention, neither leakage nor dark spots were found.

Comparative Example 1

An organic EL device was prepared as in Example 1. Instead of the inorganic insulating hole injecting layer, a hole injecting layer was formed by evaporating polythiophene at a deposition rate of 0.1 n=/sec. to a thickness of 10 nm, and a hole transporting layer was formed by evaporating TPD at a deposition rate of 0.1 nm/sec. to a thickness of 20 nm. The device was examined for life.

This organic EL device deteriorated to less than 60% of the initial luminance within 200 hours of operation. Current leakage and dark spots were observed.

Comparative Example 2

An organic EL device was prepared as in Example 1 except that in the step of depositing the inorganic insulating hole injecting layer, the target used was changed to the composition $SiO_2$ containing 3 at % of Ni, and the sputtering gas was changed to 20% argon and 80% oxygen. The resulting layer had the composition $SiO_{2.4}$ containing 2.5 at % of Ni.

When driven at 10 MA/$cm^2$, this organic EL device showed an initial luminance as low as 95 cd/$m^2$.

Comparative Example 3

An organic EL device was prepared as in Example 1 except that the inorganic insulating hole injecting layer had the composition $SiO_{1.6}$ containing 2.5 at % of Ni. The device was examined for life.

As this organic EL device was operated, the drive voltage rose. The device deteriorated to less than 50% of the initial luminance within 50 hours of operation. Also, the initial luminance was lower than that of Example 1.

Comparative Example 4

An organic EL device was prepared as in Example 1 except that the inorganic insulating hole injecting layer had the composition $SiO_{1.9}$ containing 15 at % of Ni. The device was examined for life.

As this organic EL device was operated, the drive voltage rose. The device deteriorated to less than 50% of the initial luminance within 50 hours of operation.

The organic EL devices of the present invention can block electrons and permit effective and stable injection of holes into the light emitting layer for a long time, providing a higher luminance and a longer life than those of Comparative Examples.

In Example 1, when the composition of the inorganic insulating hole injecting layer was changed from $SiO_{1.9}$ containing 2.5 at % of Ni to $GeO_{1.9}$ containing 2.5 at % of Ni or $Si_{0.5}Ge_{0.5}O_{1.98}$ containing 2.5 at % of Ni, the device maintained more than 60% the initial luminance even after 200 hours of operation.

In Examples 1 and 2, when nickel in the hole injecting layer was replaced by an equal amount of tin or copper, the device showed an equal life to Examples 1 and 2. Also, when nickel was replaced by iron, ruthenium, or gold, similar effects were observed.

There has been described an organic EL device having an inorganic insulating hole injecting layer of silicon and/or germanium oxide containing Cu, Fe, Ni, Ru, Sn, or Au between a hole injecting electrode and an organic layer, which can take advantage of both organic and inorganic materials, and has an extended effective life, an improved efficiency, a low drive voltage and a low cost. Moreover, the organic EL device of the present invention is of great commercial value for use as high-performance flat-panel color displays.

The invention has been described in detail with particular reference to preferred embodiments thereof, but it will be understood that variations and modifications can be effected within the spirit and scope of the invention.

What is claimed is:

1. An organic electroluminescent device comprising a hole injecting electrode, an electron injecting electrode, at least one organic layer between the electrodes, and an inorganic insulating hole injecting layer between said hole injecting electrode and said at least one organic layer, said inorganic insulating hole injecting layer containing, as a main component, silicon oxide or germanium oxide or a mixture of silicon oxide and germanium oxide, the main component being represented by the formula: $(Si_{1-x}Ge_x)O_y$ wherein x is from 0 to 1 and y is from 1.7 to 2.2, said inorganic insulating hole injecting layer further containing at least one element selected from the group consisting of copper, iron, nickel, ruthenium, tin, and gold.

2. The organic electroluminescent device of claim 1 wherein said inorganic insulating hole injecting layer contains up to 10 at % of at least one element selected from the group consisting of copper, iron, nickel, ruthenium, tin, and gold.

3. The organic electroluminescent device of claim 1 wherein said inorganic insulating hole injecting layer has a thickness of 0.1 to 10 nm.

* * * * *

UNITED STATES PATENT AND TRADEMARK OFFICE
CERTIFICATE OF CORRECTION

PATENT NO. : 6,222,314 B1
DATED : April 24, 2001
INVENTOR(S) : Arai et al.

It is certified that error appears in the above-identified patent and that said Letters Patent is hereby corrected as shown below:

Title page, item [54],
Top of column 1, the title should be:

-- [54] ORGANIC ELECTROLUMINESCENT DEVICE WITH INORGANIC INSULATING HOLE INJECTING LAYER --

Signed and Sealed this

Thirteenth Day of November, 2001

Attest:

NICHOLAS P. GODICI
Attesting Officer  *Acting Director of the United States Patent and Trademark Office*